(12) United States Patent
Jung

(10) Patent No.: US 11,928,441 B2
(45) Date of Patent: Mar. 12, 2024

(54) SEMICONDUCTOR MEMORY DEVICE

(71) Applicant: SAMSUNG ELECTRONICS CO., LTD., Suwon-si (KR)

(72) Inventor: Bong-Kil Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 527 days.

(21) Appl. No.: 17/222,494

(22) Filed: Apr. 5, 2021

(65) Prior Publication Data
US 2022/0035597 A1    Feb. 3, 2022

(30) Foreign Application Priority Data
Jul. 30, 2020   (KR) .................. 10-2020-0094942

(51) Int. Cl.
*G06F 7/50* (2006.01)
*H01L 23/535* (2006.01)
*H10B 41/27* (2023.01)
*H10B 41/41* (2023.01)
*H10B 43/27* (2023.01)
*H10B 43/40* (2023.01)

(52) U.S. Cl.
CPC .............. *G06F 7/50* (2013.01); *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC ........................................ G06F 7/50
USPC ........................................ 327/352
See application file for complete search history.

(56) References Cited

U.S. PATENT DOCUMENTS

| | | |
|---|---|---|
| 8,726,114 B1 * | 5/2014 | Vahidsafa .............. G11C 29/36 714/733 |
| 9,129,050 B2 | 9/2015 | Lippett et al. |
| 9,239,359 B2 | 1/2016 | Marinissen et al. |
| 9,244,865 B2 | 1/2016 | Hutchinson et al. |
| 10,120,740 B2 | 11/2018 | Lea et al. |
| 10,656,202 B1 | 5/2020 | Tan et al. |
| 2020/0013476 A1 | 1/2020 | Konan et al. |

\* cited by examiner

*Primary Examiner* — Tomi Skibinski
(74) *Attorney, Agent, or Firm* — F. Chau & Associates, LLC

(57) ABSTRACT

A semiconductor memory device is provided, comprising: a memory cell region including a memory cell array; and a peripheral circuit region which at least partially overlaps the memory cell region and includes control logic configured to control operation of the memory cell array, wherein the control logic includes a state machine configured to output a plurality of state signals responsive to operation commands of the memory cell region, the plurality of state signals including a first state signal output from a first output terminal, and a second state signal output from a second output terminal different from the first output terminal, a logical sum calculator configured to perform a logical sum calculation based on at least one of the first state signal or the second state signal, and an accumulation circuit configured to receive an output of the logical sum calculator as a clock signal, and that outputs a toggle signal to one probing pad in response to the clock signal, the accumulation circuit being connected to the probing pad through a Through Hole Via (THV) penetrating the memory cell region.

20 Claims, 13 Drawing Sheets

40

SEMICONDUCTOR MEMORY DEVICE

CROSS-REFERENCE

This application claims priority under 35 U.S.C. § 119 to Korean Patent Application No. 10-2020-0094942 filed on Jul. 30, 2020 in the Korean Intellectual Property Office, the disclosure of which is incorporated by reference in its entirety.

FIELD OF THE DISCLOSURE

The present disclosure relates to semiconductor memory devices, and more particularly relates to stacked semiconductor memory devices with through hole vias.

DISCUSSION OF RELATED ART

With ongoing developments in the electronics industry, there are increasing demands for higher functionality, higher speed, and miniaturization of electronic components. As a result, a semiconductor memory device in which memory cells are three-dimensionally stacked has been actively studied to improve a degree of integration of the semiconductor memory device, and structures in which memory cells are three-dimensionally stacked on a peripheral circuit for the operation of the semiconductor memory device have also been studied.

In the case of a semiconductor memory device in which memory cells are stacked on the peripheral circuit, a Through Hole Via (THV) is used when executing an operation test on the peripheral circuit. However, because the total number of THVs that may be placed in the semiconductor memory device is limited, and the number of THVs for supplying the power and operating signals of the memory device increases with increasing degrees of integration, the number of THVs for testing is adjusted.

SUMMARY

An embodiment of the present disclosure provides a semiconductor memory device including an accumulation circuit for checking the output sequence of a state machine that reduces the number of probing pads for testing and the number of Through Hole Vias (THVs) connected to the probing pads.

However, embodiments of the present disclosure are not restricted to those set forth herein. The above and other embodiments of the present disclosure may become more apparent to those of ordinary skill in the art to which the present disclosure pertains by referencing the detailed description of the present disclosure given below.

According to an embodiment of the present disclosure, a semiconductor memory device comprises: a memory cell region including a memory cell array; and a peripheral circuit region which at least partially overlaps the memory cell region and includes control logic configured to control operation of the memory cell array, wherein the control logic includes a state machine configured to output a plurality of state signals responsive to operation commands of the memory cell region, the plurality of state signals including a first state signal output from a first output terminal, and a second state signal output from a second output terminal different from the first output terminal, a logical sum calculator configured to perform a logical sum calculation based on at least one of the first state signal or the second state signal, and an accumulation circuit configured to receive an output of the logical sum calculator as a clock signal, and that outputs a toggle signal to one probing pad in response to the clock signal, the accumulation circuit being connected to the probing pad through a Through Hole Via (THV) penetrating the memory cell region.

According to an embodiment of the present disclosure, a semiconductor memory device comprises: a memory cell array; a state machine configured to output a plurality of state signals in response to operation commands of the memory cell array, and that includes a first flip-flop which outputs a first state signal among the plurality of state signals, and a second flip-flop which outputs a second state signal which is output after the output of the first state signal among the plurality of state signals; a logical sum calculator configured to perform a logical sum calculation based on at least one of the first state signal or the second state signal; and an accumulation circuit configured to receive an output of the logical sum calculator as a clock signal and output a toggle signal, the output of the accumulation circuit being fed back and provided to the accumulation circuit.

According to an embodiment of the present disclosure, a semiconductor memory device comprises: a memory cell region including a first conductive element; a peripheral circuit region which includes a second conductive element vertically connected to the first conductive element, and is vertically connected to the memory cell region through the first and second conductive elements; a plurality of cell strings each of which includes a plurality of memory cells in the memory cell region, the plurality of cell strings including a plurality of word lines connected to the plurality of memory cells, a plurality of bit lines connected to one end of the plurality of cell strings, and a ground selection line connected to the other end of the plurality of cell strings; a state machine configured to output a plurality of state signals in response to operation commands of the plurality of cell strings inside the peripheral circuit region, the plurality of state signals including a first state signal output from a first output terminal, and a second state signal output after the output of the first state signal from a second output terminal different from the first output terminal; a logical sum calculator configured to perform a logical sum calculation based on at least one of the first state signal and the second state signal; and control logic including an accumulation circuit configured to receive the output of the logical sum calculator as a clock signal, and to output a toggle signal to one probing pad in response to the clock signal, the accumulation circuit being connected to the probing pad through a Through Hole Via (THV) penetrating the memory cell region.

BRIEF DESCRIPTION OF THE DRAWINGS

The above and other embodiments of the present disclosure may become more apparent by considering in detail embodiments thereof with reference to the attached drawings, in which.

DETAILED DESCRIPTION OF EMBODIMENTS

Figure 1:
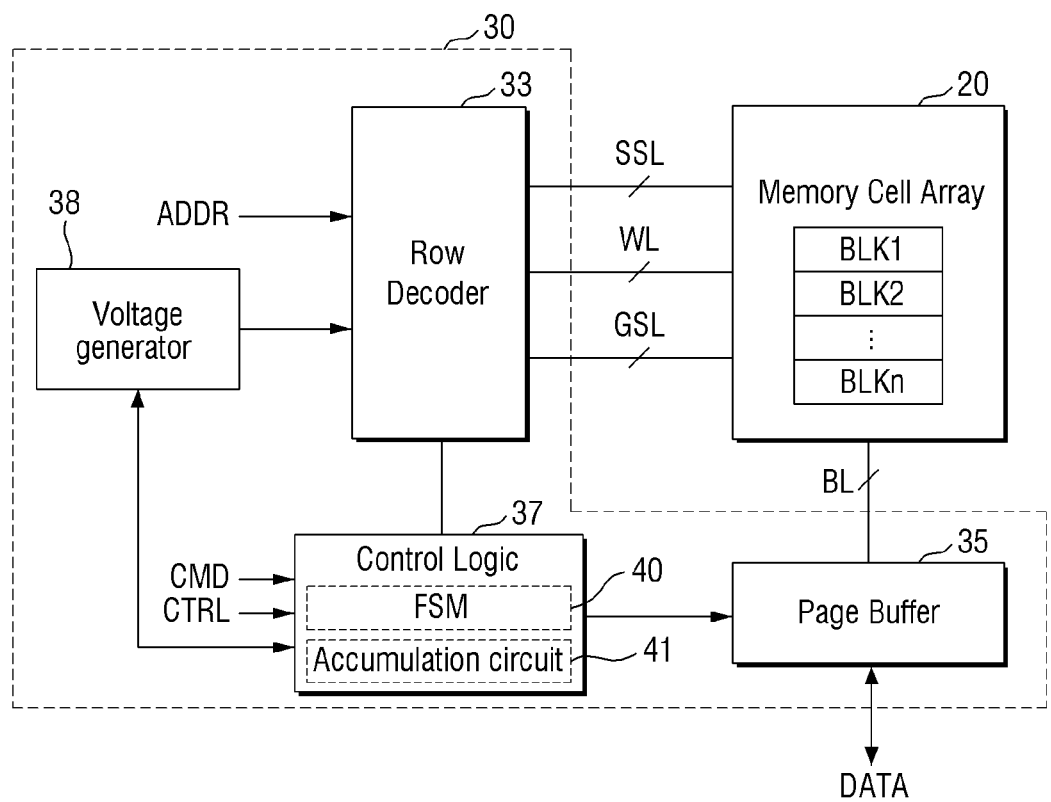
FIG. 1 is a block diagram showing a semiconductor memory device according to an embodiment.

Hereinafter, embodiments according to the inventive concept of the present disclosure may be described while referring to the accompanying drawings. In the description of FIGS. 1 to 13, the same reference numerals may be used for substantially the same components, and repeated explanation of the components need not be provided. Also, similar reference numerals may be used for similar components throughout various drawings of the present disclosure.

FIG. 1 shows a semiconductor memory device 10 according to an embodiment.

Referring to FIG. 1, the semiconductor memory device 10 may include a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell blocks BLK1 to BLKn may be connected to the peripheral circuit 30 through bit lines BL, word lines WL, at least one string selection line SSL and at least one ground selection line GSL.

Specifically, the memory cell blocks BLK1 to BLKn may be connected to a row decoder 33 of the peripheral circuit 30 through the word lines WL, at least one string selection line SSL and at least one ground selection line GSL. Also, the memory cell blocks BLK1 to BLKn may be connected to a page buffer 35 of the peripheral circuit 30 through the bit lines BL.

The peripheral circuit 30 may receive an address ADDR, a command CMD and a control signal CTRL from outside of the semiconductor memory device 10, and may send and/or receive data to and from a device outside the semiconductor memory device 10. The peripheral circuit 30 may include control logic 37, a row decoder 33, a page buffer 35, and a voltage generator 38 that generates various voltages used for operation.

The peripheral circuit 30 may further include various sub-circuits such as input/output (I/O) circuits, and an error correction circuit for correcting an error in data that is read from the memory cell array 20 of the semiconductor memory device 10.

The control logic 37 may include a finite state machine (FSM) 40 and an accumulation circuit 41. The finite state machine 40 is a circuit that outputs a state signal according to the command CMD and/or the control signal CTRL that are input from the outside and/or a time change. Further, the control logic 37 may monitor the state signal to be output from the finite state machine 40 through the accumulation circuit 41. In an alternate embodiment, the finite state machine 40 and the accumulation circuit 41 may be included in another configuration inside the peripheral circuit 30, and the inventive concepts of the present application are not limited to the arrangement of FIG. 1. A more specific explanation of the finite state machine 40 and the accumulation circuit 41 may be found further below.

The control logic 37 may be connected to the row decoder 33, the voltage generator 38, the page buffer 35 and/or any other I/O circuits. The control logic 37 may control the overall operations of the semiconductor memory device 10. The control logic 37 may generate various internal control signals used in the semiconductor memory device 10 in response to the control signal CTRL.

For example, the control logic 37 may adjust the voltage levels to be provided to the word lines WL and the bit lines BL when performing memory operations, such as a program operation or an erase operation.

The row decoder 33 may select at least one of a plurality of memory cell blocks BLK1 to BLKn in response to an address ADDR, and may select at least one word line WL, at least one string selection line SSL and at least one ground selection line GSL of the selected memory cell blocks BLK1 to BLKn. The row decoder 33 may transmit a voltage for performing the memory operation to the word line WL of the selected memory cell blocks BLK1 to BLKn.

The page buffer 35 may be connected to the memory cell array 20 through the bit lines BL. The page buffer 35 may operate as a write driver or a sense amplifier. Specifically, at the time of a program operation, the page buffer 35 operates as a write driver, and may apply a voltage to the bit lines BL according to the data to be stored in the memory cell array 20. On the other hand, at the time of a read operation, the page buffer 35 operates as a sense amplifier and may sense the data stored in the memory cell array 20.

The voltage generator 38 may provide voltage to all configurations in the semiconductor memory device according to the signal transmitted to the control logic 37. Although the drawings show that voltage is provided to the row decoder 33, a voltage required for the operation of the semiconductor memory device 10 may also be provided to the page buffer 35 and the control logic 37, without being limited thereto.

Figure 2:
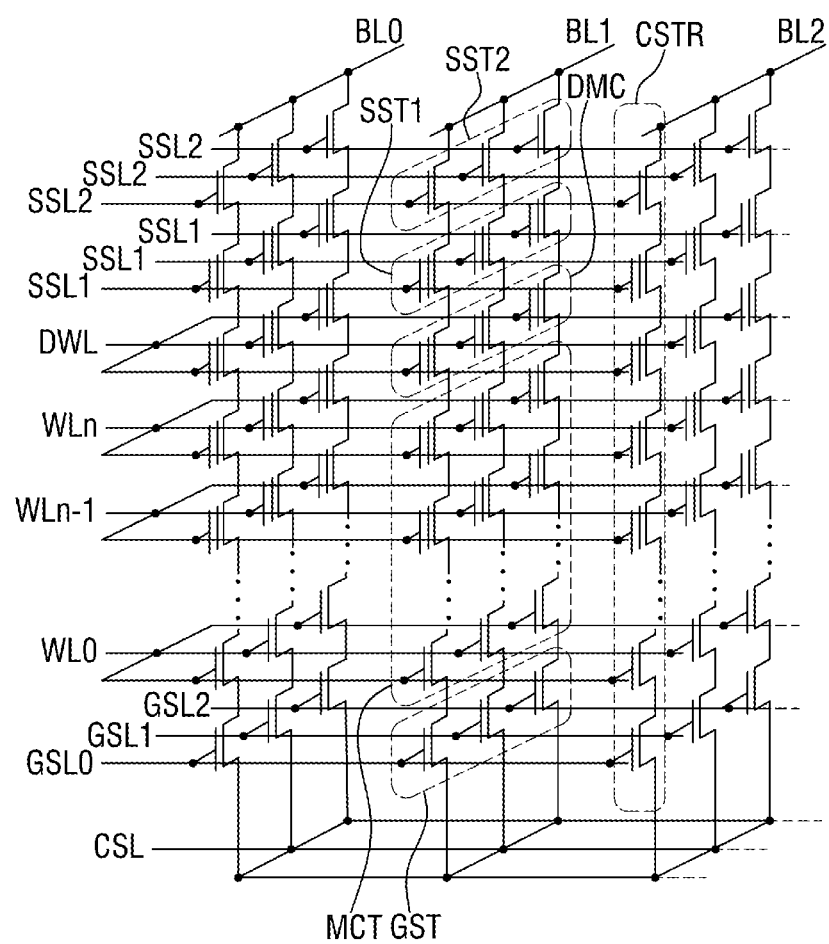
FIG. 2 is a circuit diagram showing a single memory cell block of a plurality of memory cell blocks included in a semiconductor memory device according to an embodiment.

FIG. 2 shows a single memory cell block among the plurality of memory cell blocks BLK1 to BLKn included in the semiconductor memory device 10 according to an embodiment. The single memory cell block of FIG. 2 may correspond to one of the plurality of memory cell blocks BLK1 to BLKn shown in FIG. 1.

Referring to FIG. 2, the memory cell block according to an embodiment may include a common source line CSL, a plurality of bit lines BL0, BL1 and BL2, and a plurality of cell strings CSTR placed between the common source line CSL and the bit lines BL0, BL1 and BL2.

A plurality of cell strings CSTR may be connected in parallel to each of the bit lines BL0 to BL2. The plurality of cell strings CSTR may be connected in common to the common source line CSL. For example, three cell strings CSTR are connected to each of the bit lines in the embodiment of FIG. 2, without limitation thereto. That is, the plurality of cell strings CSTR may be placed between the plurality of bit lines BL0 to BL2 and one common source line CSL. A plurality of common source lines CSL may be placed two-dimensionally. Here, the same voltage may be electrically applied to the common source line CSL, or each of the common source lines CSL may be commonly and/or individually electrically controlled.

For example, each cell string CSTR may be made up of a serially connected string selection transistors SST1 and SST2, serially connected memory cells MCT, and a ground selection transistor GST. Also, each memory cell MCT includes a data storage element.

As an example, each cell string CSTR may include a serially connected first and second string select transistor SST1 and SST2, the second string select transistor SST2 may be connected to the bit lines BL0 to BL2, and the ground selection transistor GST may be connected to the common source line CSL. The memory cells MCT may be connected in series between the first string selection transistor SST1 and the ground selection transistor GST.

Furthermore, each cell string CSTR may further include a dummy cell DMC connected between the first string selection transistor SST1 and the memory cells MCT. The dummy cell DMC may alternatively be connected between the ground selection transistor GST and the memory cells MCT. As an example, in each cell string CSTR, the ground selection transistor GST as well as the first and second string selection transistors SST1 and SST2 may each be made up of a plurality of Metal Oxide Semiconductor (MOS) transistors connected in series. As an alternate example, each cell string CSTR may include a single string selection transistor.

According to an embodiment, the first string selection transistor SST1 may be controlled by the first string selection line SSL1, and the second string selection transistor SST2 may be controlled by the second string selection line SSL2. The memory cells MCT may be controlled by a plurality of word lines WL0 to WLn, and the dummy cell DMC may be controlled by the dummy word line DWL. Also, the ground selection transistor GST may be controlled by a ground selection line GSL0, GSL1 or GSL2. The common source line CSL may be commonly connected to the sources of the ground selection transistors GST.

A single cell string CSTR may be made up of a plurality of memory cells MCTs having different distances from the common source line CSL. Further, a plurality of word lines WL0 to WLn and DWL may be placed between the common source line CSL and the bit lines BL0 to BL2.

The gate electrodes of the memory cells MCT placed at substantially the same distance from the common source line CSL are commonly connected to one of the word lines WL0 to WLn and DWL and may be in an equipotential state. Alternatively, even when the gate electrodes of the memory cells MCT are placed at substantially the same level from the common source line CSL, gate electrodes placed in different rows or columns may be controlled independently.

The ground selection lines GSL0 to GSL2 and the string selection lines SSL1 and SSL2 may extend, for example, in the same direction as the word lines WL0 to WLn and DWL. The ground selection lines GSL0 to GSL2, which are placed at substantially the same level from the common source line CSL, may be electrically separated from each other. Similarly, the string selection line SSL1 and SSL2, which may be placed at different levels from the common source line CSL, may be electrically separated from each other.

Figure 3:
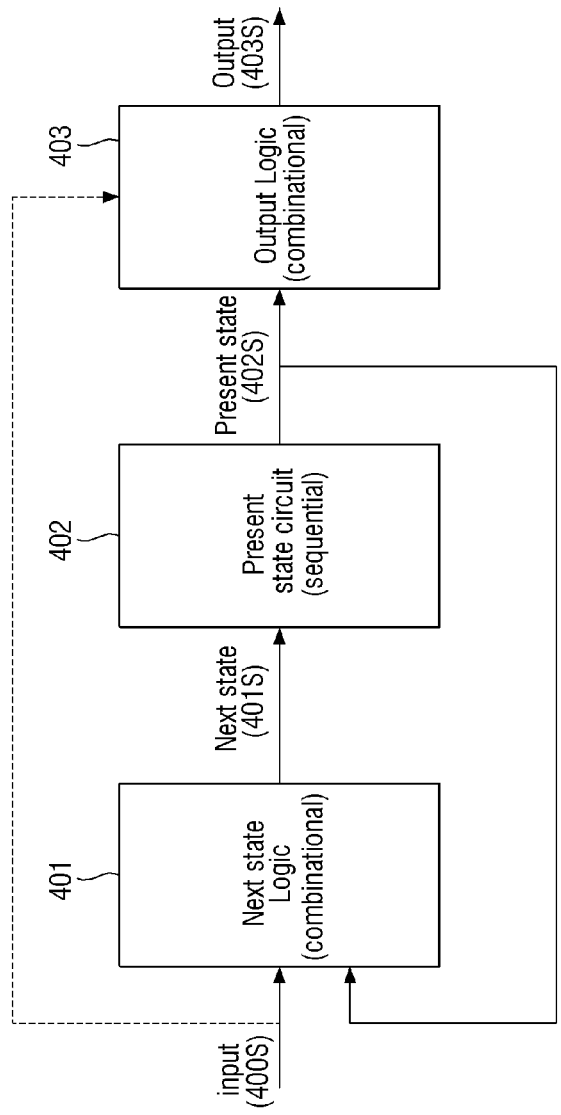
FIG. 3 is a block diagram for explaining a finite state machine according to an embodiment of the present disclosure.
Figure 4:
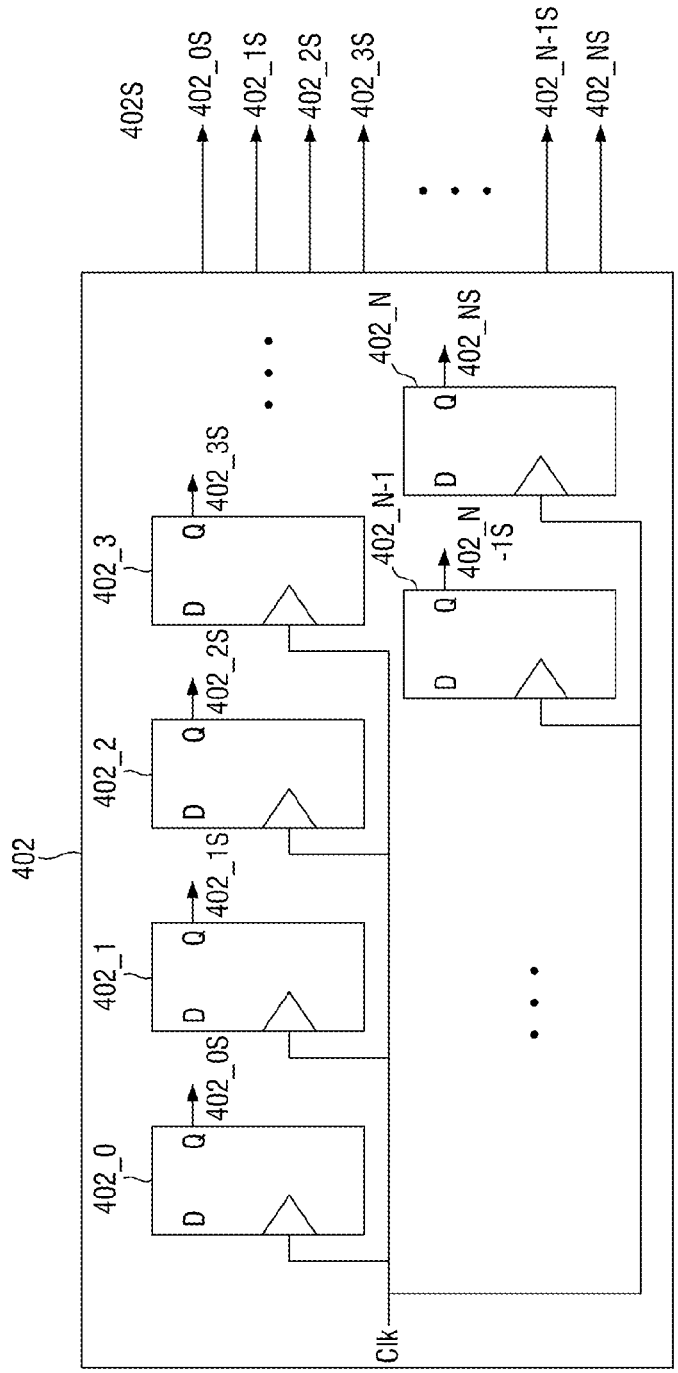
FIG. 4 is a block diagram for explaining a finite state machine according to an embodiment of the present disclosure.
Figure 5:
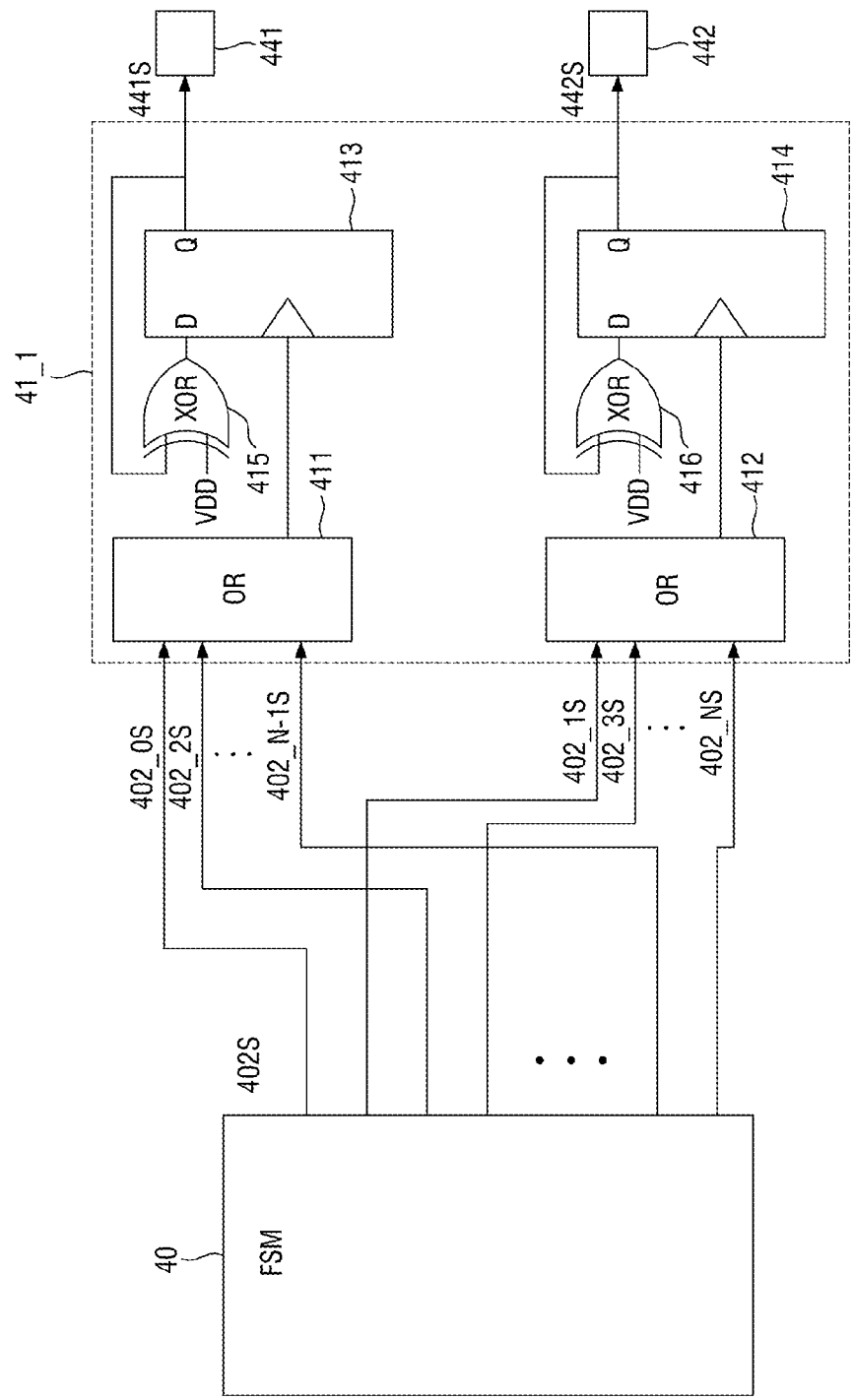
FIG. 5 is a block diagram for explaining the finite state machine and an accumulation circuit according to an embodiment of the present disclosure.

FIGS. 3 and 4 are used for explaining the finite state machine 40 of FIG. 1 according to an embodiment of the present disclosure. FIG. 5 is used for explaining the finite state machine 40 and the accumulation circuit 41 according to an embodiment of the present disclosure.

Referring to FIGS. 3 and 4, the finite state machine 40 is a system that outputs a state signal based on a command (e.g., CMD of FIG. 1) and/or a control signal (e.g., CTRL of FIG. 1) which are input from the outside of the semiconductor memory device 10 according to an embodiment, and the time change, where the finite state machine 40 may include next state logic 401, a present state circuit 402, and output logic 403.

The next state logic 401 and the output logic 403 may include arithmetic logic units which, in turn, may each include an arithmetic calculator having an adder (+) and a subtractor (−) as hardware, and logical calculators including a logical sum operator (OR), a logical product operator (AND) and an exclusive logical sum operator (XOR), and may each be combinational circuits in which their interconnection relationships may include serial, parallel, and combinations thereof.

The next state logic 401 receives an input signal 400S associated with a command signal (e.g., CMD of FIG. 1) and/or a control signal (e.g., CTRL of FIG. 1), and a present state signal 402S. The input signal 400S and the present state signal 402S are subjected to processing such as arithmetic logic calculations to output the next state signal 401S.

The output logic 403 may be provided with the input signal 400S, depending on the type of finite state machine 40. When the finite state machine 40 is a Mealy state machine, where output values are determined both by its current state and the current inputs, the output logic 403 receives the input signal 400S and the present state signal 402S together to output the output signal 403S. When the finite state machine 40 is a Moore state machine, in which output values are determined solely by its current state, the output logic 403 receives the present state signal 402S to output the output signal 403S. However, the inventive concept of the present disclosure is not limited to the aforementioned types of the finite state machine 40.

The present state circuit 402 may include a latch which includes an R-S latch, an M-S latch, and/or the like which receive the input of a clock signal Clk and process the data in consideration of a time concept responsive to the clock signal, and flip-flops including a D flip-flop, a J-K flip-flop, and edge-trigger flip-flops, and/or the like, and may be a sequential circuit in which their interconnection relationships include serial, parallel, and/or combinations thereof. Although FIG. 4 shows a D flip-flop, this is for ease of explanation, and the inventive concept of the disclosure is not limited thereto.

The present state circuit 402 may include a 0th flip-flop 402_0, a first flip-flop 402_1, a second flip-flop 402_2, a third flip-flop 402_3 to an N−1th flip-flop 402_N−1, and an Nth flip-flop 402_N. The interconnection relationship between the flip-flops may include serial, parallel, and/or combinations thereof. In FIG. 4, although the flip-flop of the present state circuit 402 is shown to be provided with the common clock signal Clk, the clock signal Clk may be provided differently for each flip-flop to control each of a plurality of present state signals 402S that is output from each respective flip-flop according to this embodiment.

An output terminal of the 0th flip-flop 402_0 outputs a 0th present state signal 402_0S among the plurality of present state signals 402S, an output terminal of the first flip-flop 402_1 outputs a first present state signal 402_1S among the plurality of state signals 402S, and the output terminals of the third to Nth flip-flops 402_3 to 402_N may also output third to Nth present state signals 402_3S to 402_NS, respectively.

However, as for the flip-flops included in the present state circuits 402 according to an embodiment, the first present state signal 402_1S output from the first flip-flop 402_1 is output after the output of the 0th present state signal 402_0S is output from the 0th flip-flop 402_0, and the second present state signal 402_2S output from the second flip-flop 402_2 is output after the output of the first present state signal 402_1S is output from the first flip-flop 402_1. Hereinafter, the third to Nth output signals 402_3S to 402_NS of each of the third to Nth flip-flops 402_3 to 402_N, respectively, may also be output after output of the preceding second to N−1th output signals 402_2S to 402_N−1S. That is, each of the 1st to Nth present state signals 402_1S to 402_NS output from each of the 1sr to Nth flip-flops 402_1 to 402_N may be output sequentially after output of the preceding present state signal 402_0S to 402_N−1S, respectively.

An accumulation circuit 41_1 according to an embodiment may include a first logical sum calculator 411, a first accumulation flip-flop 413, a first exclusive logical sum calculator 415, a second logical sum calculator 412, a second accumulation flip-flop 414, and a second exclusive logical sum calculator 416.

The first logical sum calculator 411 is connected to an output terminal of even flip-flops including the 0th flip-flop 402_0, the second flip-flop 402_2, up to the N−1th flip-flop if N is an odd number, and may be provided with the 0th present state signal 402_0S, the second present state signal 402_2S, up to the N−1th present state signal 402_N−1S. The second logical sum calculator 412 is connected to the output terminals of odd flip-flops including the first flip-flop 402_1, the third flip-flop 402_3, up to the Nth flip-flop 402_N if N is an odd number, and may be provided with the first present state signal 402_1S, the third present state signal 402_3S, up to the Nth present state signal 402_NS. However, N may be an even number according to an alternate embodiment, and in this case the first logical sum calculator 411 is connected to the output terminal of the Nth flip-flop 402_N, and the second logical sum calculator 412 may be connected to the output terminal of the N−1th flip-flop 402_N−1.

The first accumulation flip-flop 413 may receive the output of the first logical sum calculator as a clock signal. The first accumulation flip-flop 413 receives the output of the first exclusive logical sum calculator 415 as a D signal. The first exclusive logical sum calculator 415 receives the output of the first accumulation flip-flop 413 by feed-back, receives a supply voltage VDD together with the output of the first accumulation flip-flop 413 and always receives at least one 1 value. A first toggle signal 441S output from the first accumulation flip-flop 413 may be provided to the first probing pad 441.

Embodiments may include pads made of metal, but are not limited thereto. For example, although embodiments may refer to pads made of metal, it shall be understood that such pads may be formed of any conductive materials, such as non-metallic conductive materials and/or compounds formed primarily of non-metallic materials, without limitation.

The second accumulation flip-flop 414 may receive the output of the second logical sum calculator 412 as the clock signal. The second accumulation flip-flop 414 receives the output of the second exclusive logical sum calculator 416 as the D signal. The first exclusive logical sum calculator 415 receives the output of the first accumulation flip-flop 413 by feed-back, receives the supply voltage VDD together with the output of the first accumulation flip-flop 413 and always receives at least one 1 value. A second toggle signal 442s output from the second accumulation flip-flop 414 may be provided to a second probing pad 442. The specific operation of the accumulation circuit 41_1 may be explained in greater detail further below.

Figure 6:
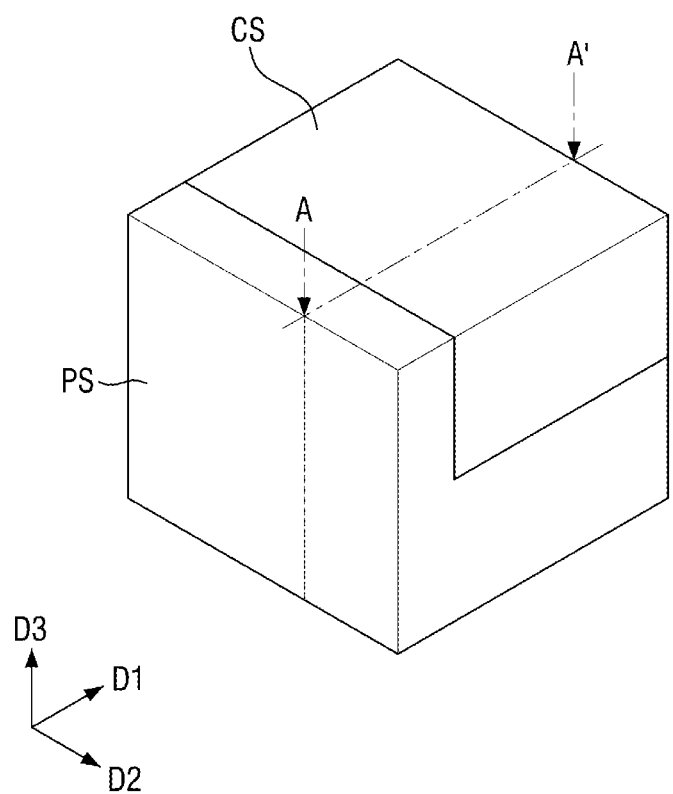
FIG. 6 is a perspective diagram showing a semiconductor memory device according to an embodiment.
Figure 7:
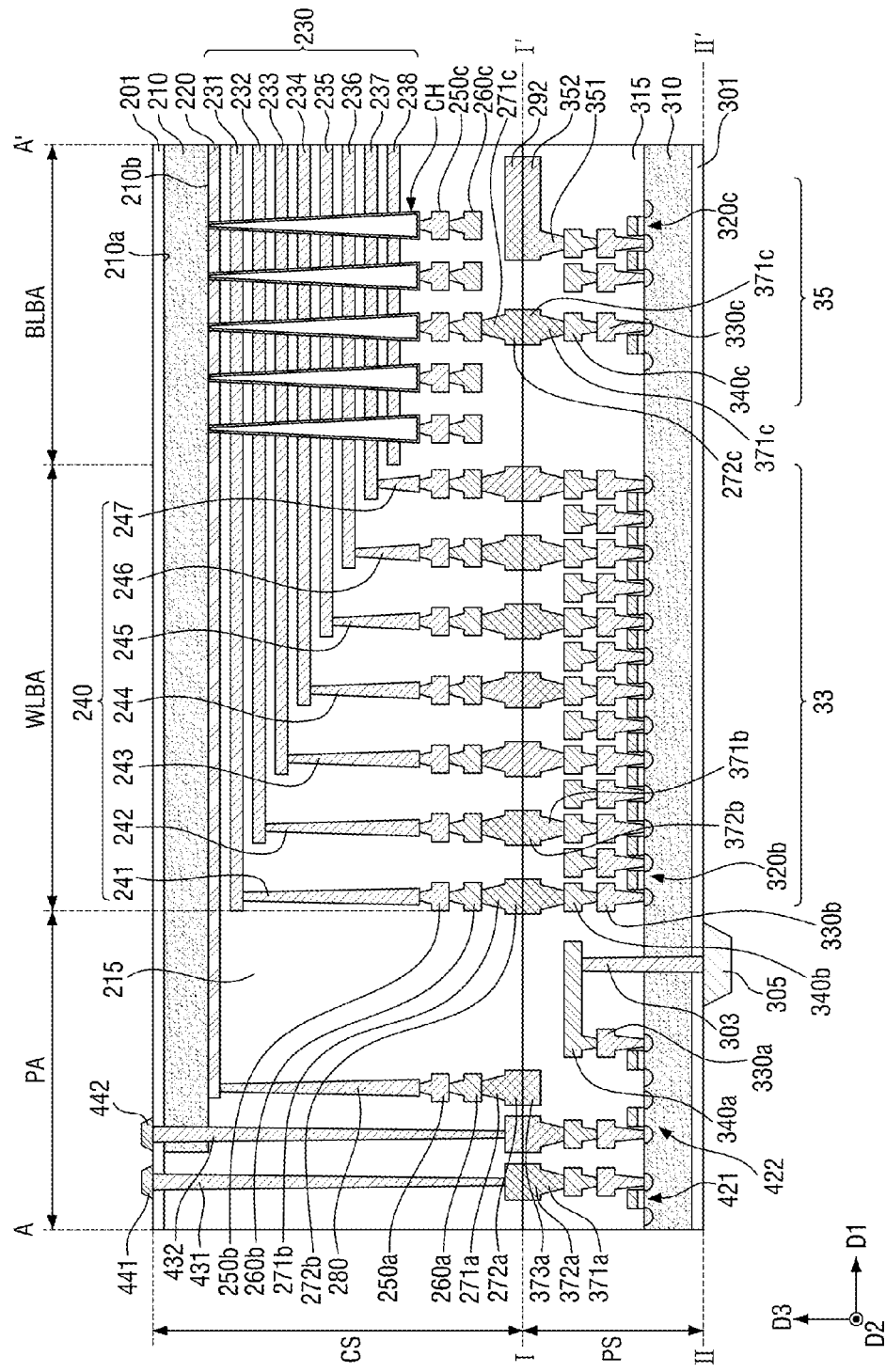
FIG. 7 is a cross-sectional diagram showing a view taken along a line A-A' of FIG. 6 for explaining a semiconductor memory device according to an embodiment of the present disclosure.

FIG. 6 is a perspective view showing the semiconductor memory device 10 according to an embodiment. FIG. 7 is a cross-sectional view taken along the line A-A' of FIG. 6 for explaining a semiconductor memory device 10_1 according to an embodiment of the present disclosure.

Referring to FIGS. 6 and 7, the semiconductor memory device 10 according to an embodiment may include a peripheral circuit region PS and a memory cell region CS.

The peripheral circuit region PS may include a buried region which overlaps the memory cell region CS in a third direction D3 from a planar viewpoint, and a non-buried region which does not overlap the memory cell region CS in the third direction D3 from the planar viewpoint. Furthermore, although it need not be included in the non-buried region, the peripheral circuit region PS may include a part of an upper wiring body placed on the memory cell region CS.

The memory cell region CS may include at least one of a plurality of memory cell blocks BLK1 to BLKn of the memory cell array 20 of FIG. 1, and the peripheral circuit region PS may include the peripheral circuit 30 of FIG. 1.

Referring to FIG. 7, the semiconductor memory device 10_1 according to an embodiment may have a chip to chip (C2C) structure. The C2C structure may mean that after an upper chip including the memory cell region CS is manufactured on a first wafer and a lower chip including the peripheral circuit region PS is manufactured on a second wafer different from the first wafer, where the upper chip and the lower chip are connected to each other by a bonding structure. As an example, the bonding structure may include a conductive path electrically connecting a bonding metal formed on an uppermost metal layer of the upper chip and a bonding metal formed on an uppermost metal layer of the lower chip to each other. For example, when the bonding metal is formed of copper (Cu), the bonding structure may be a Cu-Cu bonding structure, and the bonding metal may also be formed of aluminum or tungsten.

Each of the peripheral circuit region PS and the memory cell region CS of the semiconductor memory device 10_1 may include an external pad bonding region PA, a word line bonding region WLBA, and a bit line bonding region BLBA.

The peripheral circuit region PS may include a first substrate 310, an interlayer insulating layer 315, a plurality of circuit elements 320b and 320c formed on the first substrate 310, a first element 421 included in the first accumulation flip-flop 413 of FIG. 5, a second element 422 included in the second accumulation flip-flop 414 of FIG. 5, first metal layers 330a, 330b and 330c connected to each of the plurality of circuit elements 320b and 320c, the first element 421 and the second the second element 422, and second metal layers 340a, 340b and 340c formed on the first metal layers 330a, 330b and 330c. In an embodiment, the first metal layers 330a, 330b and 330c may be formed of tungsten which has a relatively high resistance, and the second metal layers 340a, 340b and 340c may be formed of copper which has a relatively low resistance.

Although only the first metal layers 330a, 330b and 330c and the second metal layers 340a, 340b and 340c are shown and explained in the present specification, the present disclosure is not limited thereto, and at least one or more metal layers may be further formed on the second metal layers 340a, 340b and 340c. At least some of one or more metal layers formed on the second metal layers 340a, 340b and 340c may be formed of copper or the like which has a lower resistance than the material forming the second metal layers 340a, 340b and 340c such as aluminum or the like.

The interlayer insulating layer 315 is placed on the first substrate 310 to cover the plurality of circuit elements 320b and 320c, the first element 421, the second element 422, the first metal layers 330a, 330b and 330c, and the second metal layers 340a, 340b, 340c, and may include insulating materials such as silicon oxides and/or silicon nitrides Lower bonding metals 371b and 372b may be formed on the second metal layer 340b of the word line bonding region WLBA. In the word line bonding region WLBA, the lower bonding metals 371b and 372b of the peripheral circuit region PS may be electrically connected to the upper bonding metals 271b and 272b of the memory cell region CS by a bonding structure, and the lower bonding metals 371b and 372b and the upper bonding metals 271b and 272b may be formed of aluminum, copper, tungsten, or the like.

The memory cell region CS may provide at least one of a plurality of memory cell blocks (e.g., BLK1 to BLKn of FIG. 1). The memory cell region CS may include a second substrate 210 and a common source line 220. A plurality of word lines 230 (e.g., 231 to 238) may be stacked on a lower surface 210b of the second substrate 210 along the direction D3 perpendicular to the upper surface of the second substrate 210. The string selection lines and the ground selection line may be placed above and below the word lines 230, and a plurality of word lines 230 may be placed between the string selection lines and the ground selection line.

In the bit line bonding region BLBA, the channel structure CH extends in the direction perpendicular to the upper surface of the second substrate 210 and may penetrate the word lines 230, the string selection lines, and the ground selection line. The channel structure CH may include a data storage layer, a channel layer, a buried insulating layer, and the like, and the channel layer may be electrically connected to the first metal layer 250c and the second metal layer 260c. For example, the first metal layer 250c may be a bit line contact, and the second metal layer 260c may be a bit line. In an embodiment, the bit line 260c may extend along a second direction D2 parallel to the upper surface of the second substrate 210.

In an embodiment shown in FIG. 7, the region in which the channel structure CH and the bit line 260c are placed may be defined as a bit line bonding region BLBA. The bit line 260c in the bit line bonding region BLBA may be electrically connected to the circuit elements 320c that provide a page buffer 35 in the peripheral circuit region PS. As an example, the bit line 260c is connected to the upper bonding metals 271c and 272c in the memory cell region CS, and the upper bonding metals 271c and 272c may be connected to the lower bonding metals 371c and 372c connected to the circuit elements 320c of the page buffer 35.

In the word line bonding region WLBA, the word lines 230 may extend along a first direction D1 parallel to the upper surface of the second substrate 210, and may be connected to a plurality of cell contact plugs 240 (e.g., 241 to 247). The word lines 230 and the cell contact plugs 240 are connected to each other by pads provided by extension of at least some of the word lines 230 along the first direction D1 with different lengths. A first metal layer 250b and a second metal layer 260b may be connected sequentially to the top of the cell contact plugs 240 connected to the word lines 230. The cell contact plugs 240 may be connected to the peripheral circuit region PS through the upper bonding metals 271b and 272b of the memory cell region CS and the lower bonding metals 371b and 372b of the peripheral circuit region PS in the word line bonding region WLBA.

The cell contact plugs 240 may be electrically connected to the circuit elements 320b that provide the row decoder 33 in the peripheral circuit region PS. In an embodiment, the operating voltage of the circuit elements 320b that provide the row decoder 33 may differ from the operating voltage of the circuit elements 320c that provide the page buffer 35. As an example, the operating voltage of the circuit elements 320c that provide the page buffer 35 may be higher than the operating voltage of the circuit elements 320b that provide the row decoder 33.

A common source line contact plug 280 may be placed in the external pad bonding region PA. The common source line contact plug 280 is formed of a conductive material such as metal, metal compound or polysilicon, and may be electrically connected to the common source line 220. The first metal layer 250a and the second metal layer 260a may be stacked sequentially on the top of the common source line contact plug 280. As an example, the region in which the common source line contact plug 280, the first metal layer 250a, and the second metal layer 260a are placed may be defined as an external pad bonding region PA.

On the other hand, an input/output (I/O) pad 305 and first and second probing pads 441 and 442 may be placed in the external pad bonding region PA. Referring to FIG. 7, a lower insulating film 301 which covers the lower surface of the first substrate 310 may be formed below the first substrate 310, and a first I/O pad 305 may be formed on the lower insulating film 301. The first I/O pad 305 is attached to at least one of a plurality of circuit elements 320a, 320b and/or 320c placed in the peripheral circuit region PS through the first input/output contact plug 303, and may be separated from the first substrate 310 by the lower insulating film 301. Further, a side insulating film may be placed between the first I/O contact plug 303 and the first substrate 310 to electrically separate the first I/O contact plug 303 and the first substrate 310 from each other.

Referring to FIG. 7, an upper insulating film 201 which covers the upper surface 210a of the second substrate 210 may be formed, and first and second probing pads 441 and 442 may be placed on the upper insulating film 201. Each of the first and second probing pads 441 and 442 may be connected to the first element 421 and the second element 422 placed in the peripheral circuit region PS through each of a first Through Hole Via (THV) 431 and a second THV 432, which penetrate the memory cell region CS. However, the interconnection relationship between the THV and the element is but one example. Alternatively, the first element 421 and the second THV 432 may be connected to each other, and the second element 422 and the first THV 431 may be connected to each other.

According to the embodiment, the second substrate 210 and the common source line 220 need not be placed in the region in which the first THV 431 is placed. The common source line 220 need not be placed in the region in which the second THV 432 is placed. Also, the first and second probing pads 441 and 442 need not overlap the word lines 230 in the third direction D3. Referring to FIG. 7, the first THV 431 and the second THV 432 penetrate the interlayer insulating film 215 of the memory cell region CS, and may be connected to each of the first and second probing pads 441 and 442, respectively. In FIG. 7, although the second THV 432 penetrates the second substrate 210, and the first THV 431 does not penetrate the second substrate 210, a relation between the THV and the second substrate 210 is an example, and both the first THV 431 and the second THV 432 may but need not penetrate the second substrate 210.

According to an embodiment, although the first I/O pad 305 may be selectively formed and only the first and second probing pads 441 and 42 placed on the second substrate 210, another I/O pad may be placed at a position where the first and second probing pads 441 and 442 are located.

The metal pattern of the uppermost metal layer exists as a dummy pattern in each of the external pad bonding region PA and the bit line bonding region BLBA included in each of the memory cell region CS and the peripheral circuit region PS, or the uppermost metal layer may be empty.

The semiconductor memory device 10_1 may form a lower metal pattern 373a having substantially the same shape as the upper metal pattern 272a of the memory cell region CS on the uppermost metal layer of the peripheral circuit region PS to correspond to the upper metal pattern 272a formed on the uppermost metal layer of the memory cell region CS, in the external pad bonding region PA. The lower metal pattern 373a formed on the uppermost metal layer of the peripheral circuit region PS need not be connected to a separate contact in the peripheral circuit region PS. Similarly, an upper metal pattern having the same shape as the lower metal pattern of the peripheral circuit region PS may be formed on the upper metal layer of the cell region CS to correspond to the lower metal pattern formed on the uppermost metal layer of the peripheral circuit region PS, in the external pad bonding region PA.

Lower bonding metals 371b and 372b may be formed on the second metal layer 340b of the word line bonding region WLBA. In the word line bonding region WLBA, the lower bonding metals 371b and 372b of the peripheral circuit region PS may be electrically connected to the upper bonding metals 271b and 272b of the memory cell region CS by a bonding structure.

Further, an upper metal pattern 292 having the same shape as the lower metal pattern 352 of the peripheral circuit region PS may be formed on the uppermost metal layer of the cell region CS to correspond to the lower metal pattern 352 formed on the uppermost metal layer of the peripheral circuit region PS, in the bit line bonding region BLBA. The contact need not be formed on the upper metal pattern 292 formed on the uppermost metal layer of the memory cell region CELL.

Figure 8:
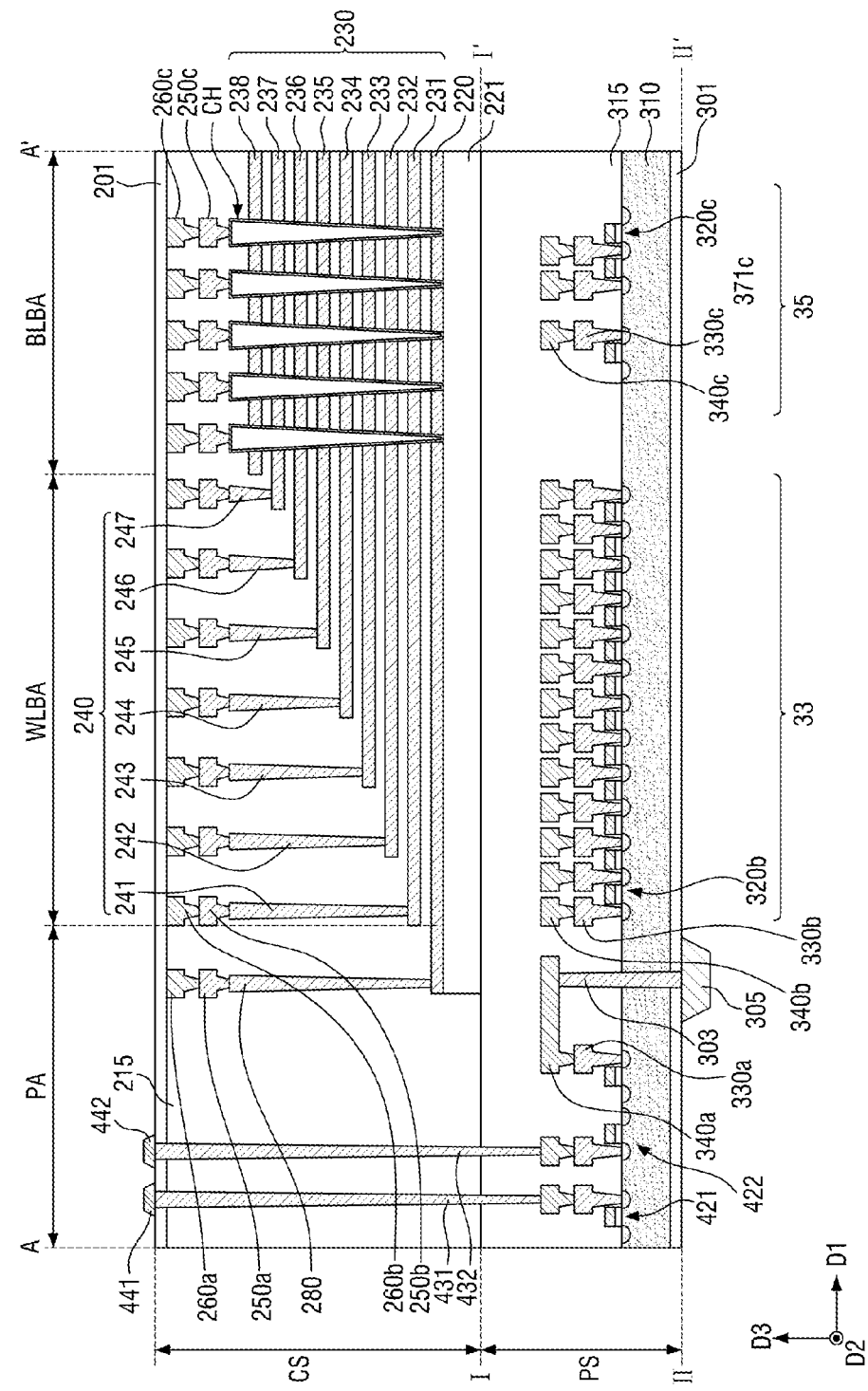
FIG. 8 is a cross-sectional diagram showing a view taken along the line A-A' of FIG. 6 for explaining a semiconductor memory device according to some other embodiment of the present disclosure.

FIG. 8 is a cross-sectional view taken along the line A-A' of FIG. 6 to explain a semiconductor memory device 10_2 according to an embodiment of the present disclosure.

Hereinafter, the semiconductor memory device 10_2 according to an embodiment of the present disclosure may be explained referring to FIG. 8. Differences from the semiconductor memory device 10_1 shown in FIG. 7 may be mainly explained, and substantially duplicate description may be omitted.

When compared with the semiconductor memory device 10_1 of FIG. 7, the lower bonding metals 371a to 371c, 372a to 372c and 373a and the lower metal pattern 352 of the peripheral circuit region PS, and the upper bonding metals 271a to 271c and 272a to 272c and the upper metal pattern 292 of the memory cell region CS, which are placed between the memory cell region CS and the peripheral circuit region PS, are not placed in the semiconductor memory device 10_2 of FIG. 8.

Also, a common source line 220, a plurality of word lines 230 (e.g., 231 to 238), a plurality of cell contact plugs 240 (e.g., 241-247) and a channel structure CH may be placed between the second metal layers 340a, 340b and 340c of the peripheral circuit region PS and the second metal layers 260b and 260c of the memory cell region CS.

Accordingly, the first metal layers 250a, 250b and 250c and the second metal layers 260b and 260c of the memory cell region CS may be placed above the common source line 220, the plurality of word lines 230 (e.g., 231-238), the plurality of cell contact plugs 240 (e.g., 241-247) and the channel structure CH, on the basis of the third direction D3.

When compared with the semiconductor memory device 10_1 of FIG. 7, a horizontal semiconductor layer 221 may be placed below the common source line 220, instead of the second substrate 210 being placed above the common source line 220.

The horizontal semiconductor layer 221 may include a lower support semiconductor layer, and a common source plate on the lower support semiconductor layer. The horizontal semiconductor layer 221 may include, for example, at least one of silicon (Si), germanium (Ge), silicon germanium (SiGe), gallium arsenide (GaAs), indium gallium arsenide (InGaAs), aluminum gallium arsenide (AlGaAs), or a mixture thereof. The horizontal semiconductor layer 221 may have a crystal structure including at least one selected from single crystal, amorphous and polycrystalline.

Further, an upper insulating film 201, which covers the second metal layers 260b and 260c and the interlayer insulating film 215, may be placed on the second metal layers 260b and 260c.

In FIG. 8, although the second metal layers 340b and 340c of the peripheral circuit region PS and the second metal layers 260b and 260c of the memory cell region CS are not connected to each other, each of the second metal layers 340b and 340c of the peripheral circuit region PS and each of the second metal layers 260b and 260c of the memory cell region CS are electrically connected to each other.

Therefore, the circuit element 320b included in the row decoder 33 may be electrically connected to a plurality of word lines 230 through the first and second metal layers 330b and 340b of the peripheral circuit region PS and the first and first metal layers 250b and 260b of the memory cell region CS. Similarly, the circuit element 320c included in the page buffer 35 may be electrically connected to the channel structures CH through the first and second metal layers 330c and 340c of the peripheral circuit region PS and the first and second metal layers 250c and 260c of the memory cell region CS.

Figure 9:
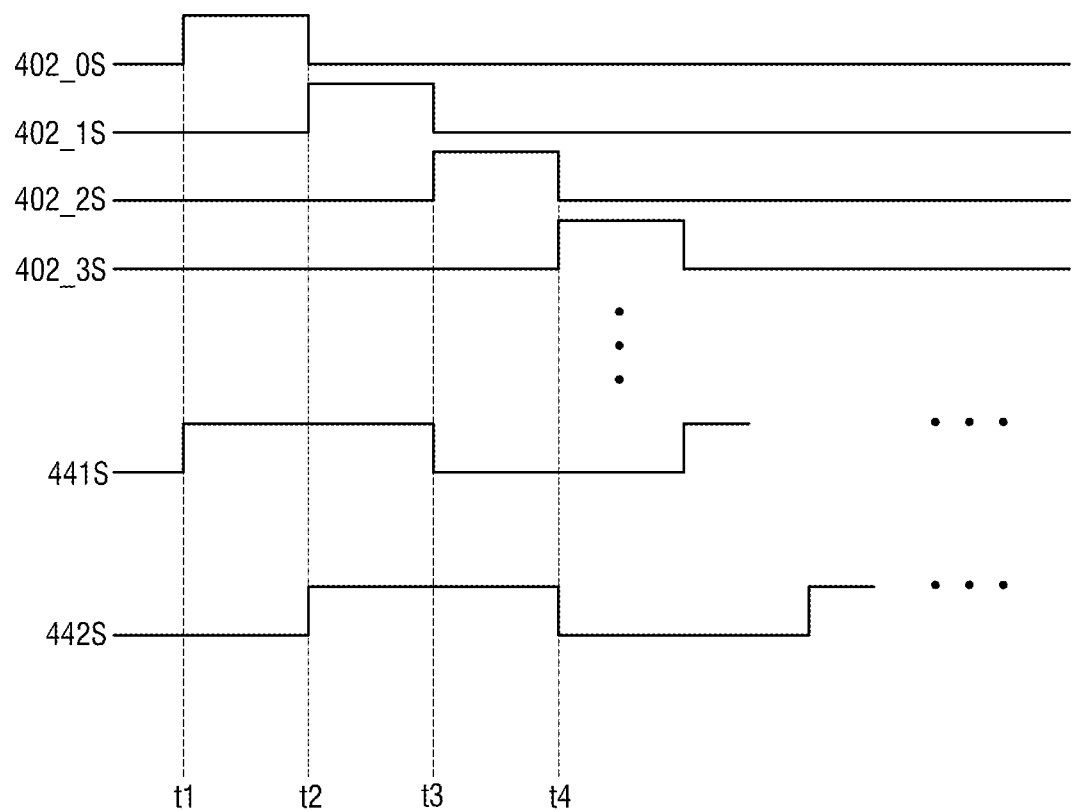
FIG. 9 is a timing diagram for explaining the operation of an accumulation circuit according to an embodiment of the present disclosure.
Figure 10:
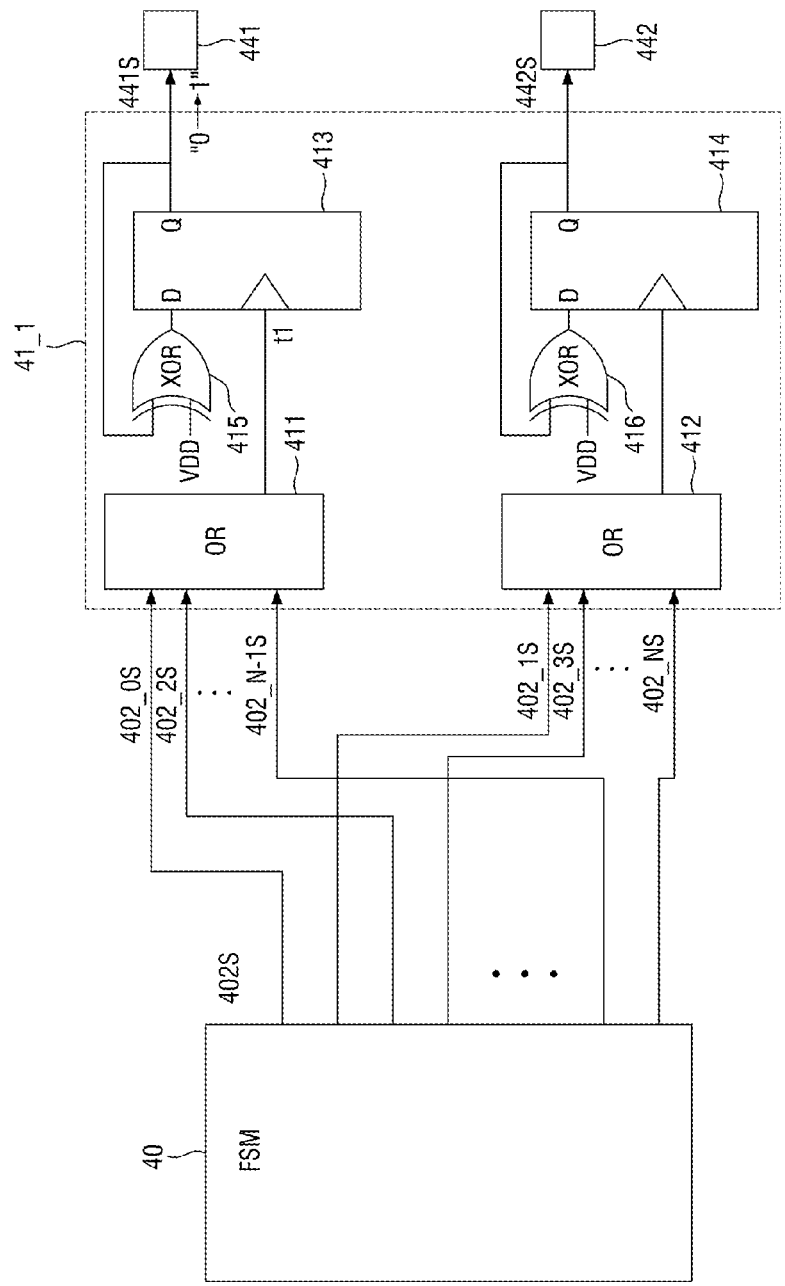
FIG. 10 is a block diagram for explaining the operation of an accumulation circuit according to an embodiment of the present disclosure.
Figure 11:
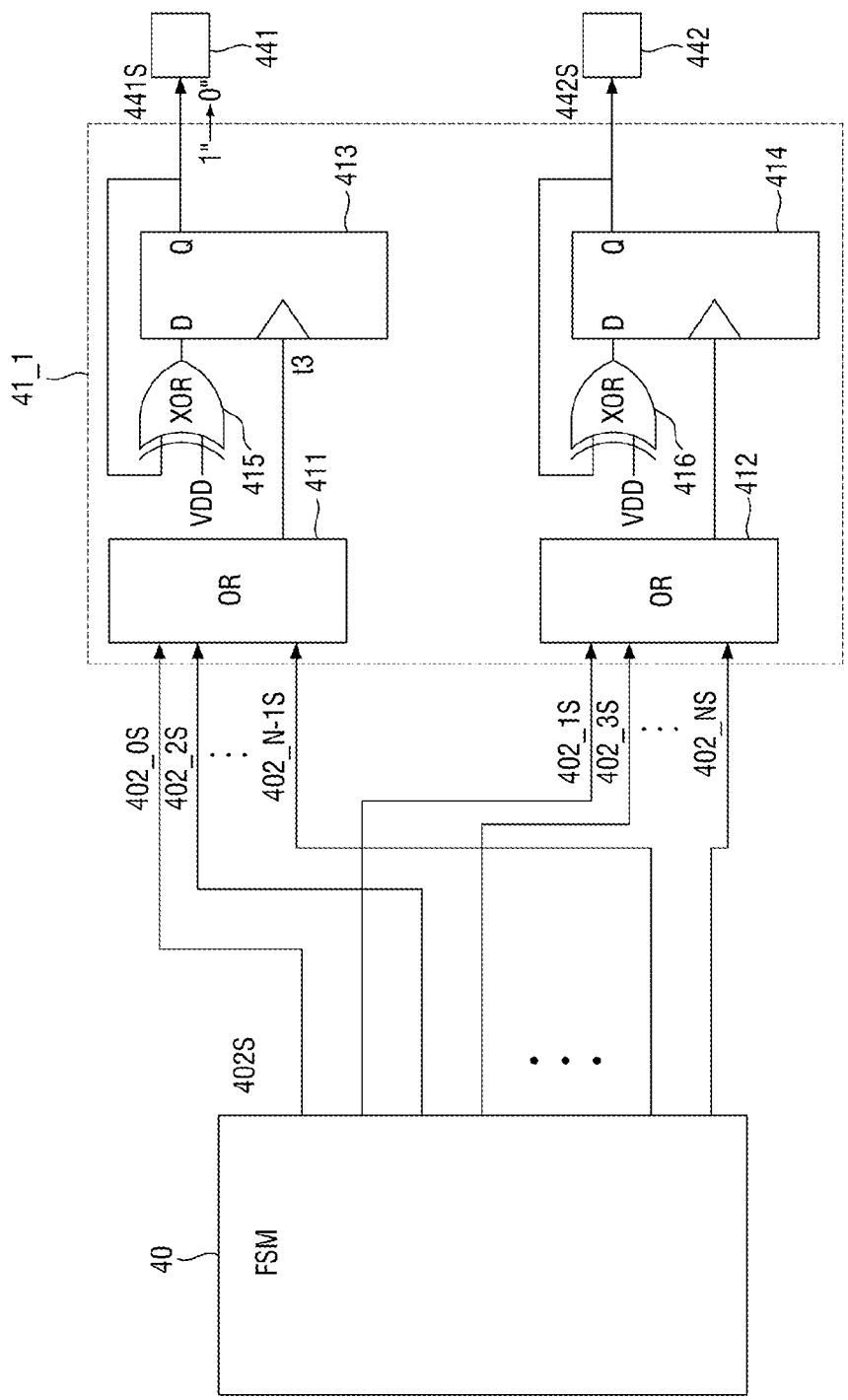
FIG. 11 is a block diagram for explaining the operation of an accumulation circuit according to an embodiment of the present disclosure.

FIGS. 9 to 11 are referenced for explaining the operation of an accumulation circuit 41_1 according to an embodiment of the present disclosure.

Referring to FIGS. 9 to 11, FIG. 9 explains the operation of the accumulation circuit 41_1 of the 0th to third present state signals 402_0S to 402_3S among the plurality of present state signals 402S for ease of explanation. Hereinafter, the same also applies to the operation of the accumulation circuit 41_1 related to the fourth to Nth present state signals 402_4S to 402_NS.

As explained above, as the plurality of present state signals 402S are provided, after the 0th present state signal 402_0S is output, the Nth present state signal 402_NS may be output sequentially as in FIG. 9. As an example, the 0th present state signal 402_0S is output at t1, and as soon as the output of the 0th present state signal 402_0S ends at t2, the first present state signal 402_1S is output. As soon as the output of the first present state signal 402_1S ends at t3, the second present state signal 402_2S is output. As soon as the output of the second present state signal 402_2S ends at t4, the third present state signal 402_3S may be output.

When assuming that the first toggle signal 441S which is the output of the first accumulation flip-flop 413 has an output of 0 value before t1, if the 0th present state signal 402_0S is output at t1, the output of the first logical sum calculator is changed from 0 value to 1 value at t1, and in response to this, the first accumulation flip-flop 413 may make the first toggle signal 441S equal to the output of the first exclusive calculator 415. The first exclusive calculator 415 may receive VDD (e.g., a 1 value) and a 0 value to output a 1 value. Therefore, the first toggle signal 441S may be changed from a 0 value to a 1 value at t1.

After that, although the output of the first logical sum calculator 411 is changed from a 1 value to a 0 value at t2, the 1 value of the first toggle signal 441S may be maintained by the operation of the first accumulation flip-flop 413.

When the second present state signal 402_2S is output at t3, the output of the first logical sum calculator 411 is changed from a 0 value to a 1 value at t3, and in response to this, the first accumulation flip-flop 413 may make the first toggle signal 441S equal to the output of the first exclusive calculator 415. The first exclusive calculator 415 may receive VDD (e.g., a 1 value) and another 1 value and may output a 0 value. Therefore, the first toggle signal 441S may be changed from a 1 value to a 0 value at t3.

After that, although the output of the first logical sum calculator 411 is changed from a 1 value to a 0 value at t2, the 1 value of the first toggle signal 441S may be maintained by the operation of the first accumulation flip-flop 413.

Because the operation of the second logical sum calculator 412, the second accumulation flip-flop 414, and the second exclusive logical sum calculator 416 at t2 and t4 corresponds to the operation of the first logical sum calculator 411, the first accumulation flip-flop 413, and the first exclusive logical sum calculator 415 at t1 and t3, the aforementioned explanation of operation may be similarly applied for explanation of the operation of the second logical sum calculator 412, the second accumulation flip-flop 414 and the second exclusive logical sum calculator 416 at t2 and t4, and substantially duplicate description may be omitted.

Therefore, if the results of the first toggle signal 441S and the second toggle signal 442S are comprehensively determined, it is possible to know that the 0th present state signal 402_0S is output between t1 and t2, the first present state signal 402_1S is output between t2 and t3, and the second present state signal 402_2S is output between t3 and t4.

Durations of each of the plurality of present state signals 402S may be monitored through the first toggle signal 441S and the second toggle signal 442S. The first toggle signal 441S and the second toggle signal 442S are provided to the first probing pad 441 and the second probing pad 442, respectively, and the state signal inside the finite state machine (FSM) 40 may be monitored through the two probing pads. The first probing pad 441 and the second probing pad 442 may correspond to the first probing pad 441 and the second probing pad 442 of FIGS. 7 and 8.

Therefore, because the number of THVs allotted for testing that are connected by each probing pad may also be reduced to two, it may be possible to increase the number of THVs allotted for efficiently supplying the power and operating signals into the semiconductor memory device 10 and/or to further miniaturize a die scale.

Figure 12:
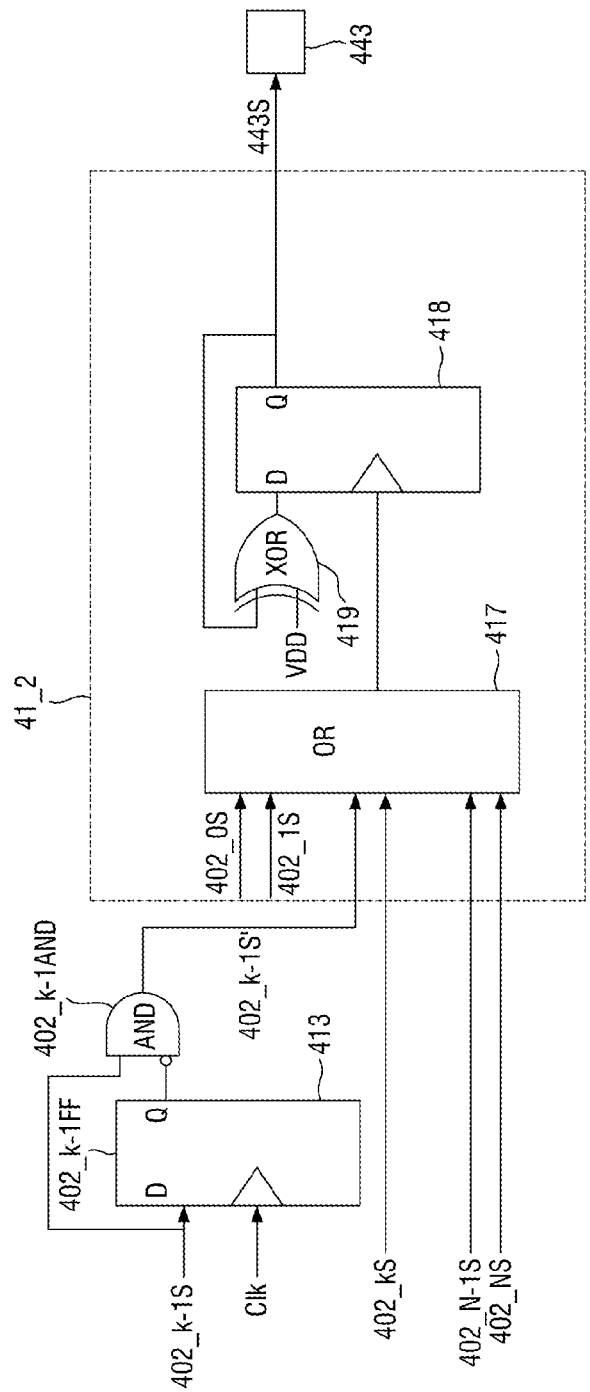
FIG. 12 is a block diagram for explaining an accumulation circuit according to an embodiment of the present disclosure.

FIG. 12 is referenced for explaining an accumulation circuit 41_2 according to an embodiment of the present disclosure.

Hereinafter, the accumulation circuit 41_2 according to an embodiment of the present disclosure may be explained referring to FIG. 12. Differences from the accumulation circuit 41_1 shown in FIG. 5 may be mainly explained, and substantially duplicate description may be omitted.

Although the output terminals of the even flip-flops and the output terminals of the odd flip-flops are connected to the accumulation circuit 41_1 with different logical sum calculators in the present state circuit 402 of FIG. 5, the third logical sum calculator 417 of the accumulation circuit 41_2 may be connected to an output terminal of a k−1th flip-flop 402_k−1 and an output terminal of a kth flip-flop 402_k that are continuous in the present state circuit 402 (where k is a natural number of 1 or more and N or less).

A k−1th present state signal 401_k−1S of the k−1th flip-flop 402_k−1 is input as the D signal of the reduction flip-flop 402_k−1FF. The output of the reduction flip-flop 402_k−1FF is input to the reduction logical product calculator 402_k−1AND together with the k−1th present state signal 401_k−1S in an inverted state 401_k−1S'.

The k−1th present state signal 401_k−1S may be input to the third logical sum calculator 417 as a k−1th reduction state signal 402_k−1S' through the reduction flip-flop 402_k−1FF and the reduction logical product calculator 402_k−1AND.

The k-th present state signal 401_kS of the k-th flip-flop 402_k may be input without going through the reduction flip-flop and the reduction logical product calculator.

The third accumulation flip-flop 418 and the third exclusive logical sum calculator 419 may correspond to the first accumulation flip-flop 413 and the first exclusive logical sum calculator 415 of FIG. 5, respectively. The third accumulation flip-flop 418 may output a third toggle signal 443S and provide it to the third probing pad 433.

Figure 13:
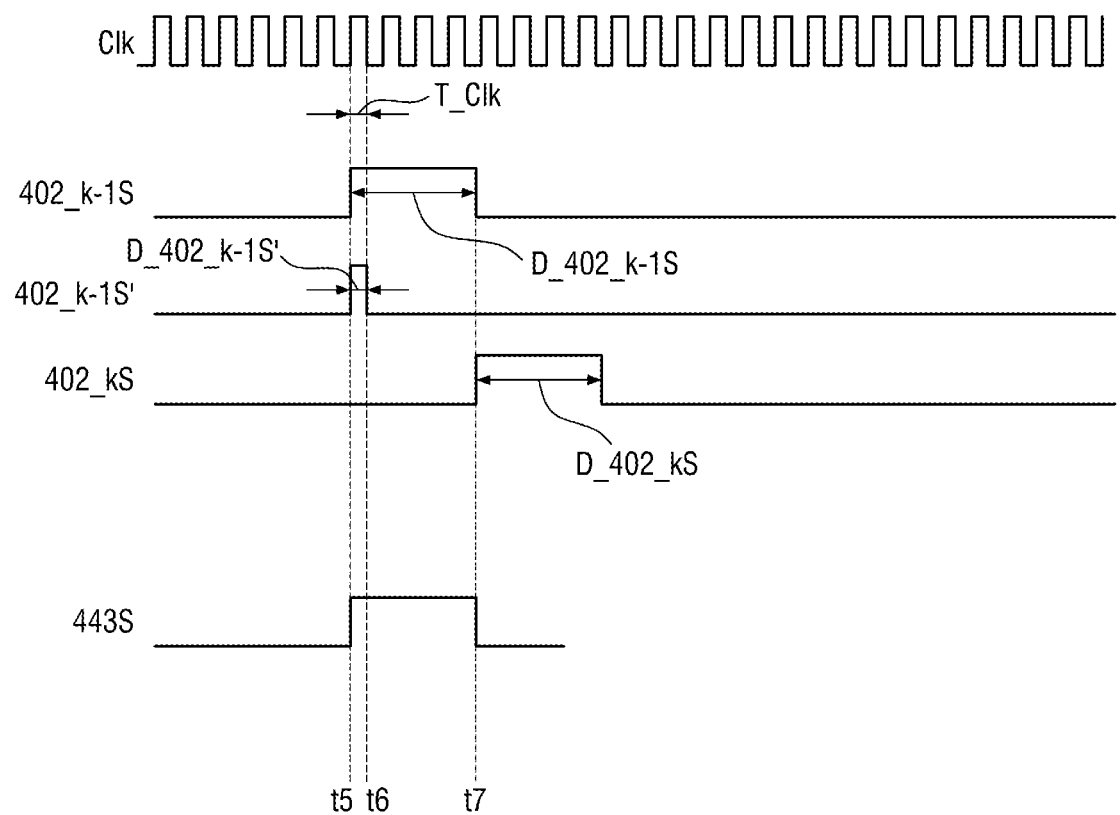
FIG. 13 is a timing diagram for explaining operation of an accumulation circuit according to an embodiment of the present disclosure.

FIG. 13 is referenced for explaining the operation of an accumulation circuit 41_2 according to an embodiment of the present disclosure.

Referring to FIGS. 12 and 13, as in the aforementioned content, as the plurality of present state signals 402S are provided, after the k−1th present state signal 402_k−1S is output, the kth present state signal 402_kS may be sequentially output as in FIG. 13. As an example, the k−1th present state signal 402_k−1S is output at t5, as soon as the output of the k−1th present state signal 402_k−1S ends at t7, the kth present state signal 402_kS may be output.

The third toggle signal 443S, which is an output of the third accumulation flip-flop 418, has an output of 0 value before t5, and the output of the reduction flip-flop 402_k−1FF has a 0 value by the operation of the reduction flip-flop 402_k−1FF and the clock signal Clk.

When the k−1th present state signal 402_k−1S is output at t5, the reduction logical product calculator 402_k−1AND operates earlier than the reduction flip-flop 402_k−1FF, a 1 value which is an inverted value of the output of the reduction flip-flop 402_k−1FF, and a 1 value of the k−1th present state signal 402_k−1S are provided, and a k−1th reduction state signal 402_k−1S' having the 1 value at t5 may be input to the third logical sum calculator 417. However, when the reduction flip-flop 402_k−1FF operates and the output of the reduction flip-flop 402_k−1FF becomes a 1 value, because the inverted value becomes 0, thereafter, the value of the k−1th reduction state signal 402_k−1S' may be 0 at t6.

After that, since the output of the reduction flip-flop 402_k−1FF maintains the 1 value from t6 to t7, an output duration D_402_k−1S' of the k−1th reduction state signal 402_k−1S' may be smaller than the output duration D_402_$k$–1S' of the k–1th present state signal 402_$k$–1S, and may be smaller than or equal to an output duration T_Clk of the clock signal Clk. Furthermore, the output duration D_402_$k$–1S' of the k–1th reduction state signal 402_$k$–1S' may be smaller than the output duration D_402_kS of the kth present state signal 402_kS.

Because the output duration D_402_$k$–1S' of the k–1th reduction state signal 402_$k$–1S' may be maintained from t5 to t6 by an operation speed difference between the reduction flip-flop 402_$k$–1FF and the reduction logical product calculator 402_$k$–1AND, a time margin from t6 to t7 may occur between the output of the k–1 reduction state signal 402_$k$–1S' and the output of the kth present state signal 402_kS.

Since the output of the third logical sum calculator 417 may be changed from a 1 value to a 0 value during the time margin from t6 to t7, after that, the output of the third logical sum calculator 417 changes from a 0 value to a 1 value at t7 by the kth present state signal 402_kS, and the third accumulation flip-flop 418 may operate.

Therefore, even if the k–1th present state signal 402_$k$–1S and the kth present state signal 402_kS are continuously output, they may be input to the same third logical sum calculator 417.

Based on this, when the even signals or the odd signals of the plurality of present state signals 402S are made to go through the reduction flip-flop and the reduction logical sum calculator in the accumulation circuit 41_2 according to an embodiment, the operation of the accumulation circuit 41_2 of the present disclosure may be performed by one third logical sum calculator 417, the third accumulation flip-flop 418, and the third exclusive logical sum calculator 419 through the time margin. Accordingly, the third accumulation flip-flop 418 may monitor duration of each of the plurality of present state signals 402S on the third probing pad 443 through the third toggle signal. Accordingly, there may be one THV allocated for testing.

However, embodiments of the present inventive concept are not restricted to the ones set forth herein. The above and other embodiments based on the scope and spirit of the present disclosure may become more apparent to those of ordinary skill in the pertinent art by referencing the following claims.

What is claimed is:

1. A semiconductor memory device comprising:
a memory cell region including a memory cell array; and
a peripheral circuit region which at least partially overlaps the memory cell region and includes control logic configured to control operation of the memory cell array,
wherein the control logic includes
a state machine configured to output a plurality of state signals responsive to operation commands of the memory cell region, the plurality of state signals including a first state signal output from a first output terminal, and a second state signal output from a second output terminal different from the first output terminal,
a logical sum calculator configured to perform a logical sum calculation based on at least one of the first state signal or the second state signal, and
an accumulation circuit configured to receive an output of the logical sum calculator as a clock signal, and that outputs a toggle signal to one probing pad in response to the clock signal, the accumulation circuit being connected to the probing pad through a Through Hole Via (THV) penetrating the memory cell region.

2. The semiconductor memory device of claim 1, wherein:
the second state signal is output after output of the first state signal,
the state machine includes a first flip-flop including the first output terminal, and a second flip-flop including the second output terminal different from the first flip-flop.

3. The semiconductor memory device of claim 2, wherein:
the first state signal is an even-numbered state signal among the plurality of state signals,
the second state signal is an odd-numbered state signal among the plurality of state signals,
the logical sum calculator includes a first logical sum calculator which performs a logical sum calculation on the first state signal, and a second logical sum calculator which performs a logical sum calculation on the second state signal, and
the accumulation circuit includes a first accumulation circuit which receives output of the first logical sum calculator as a first clock signal and outputs a first toggle signal to a first probing pad in response to the first clock signal, and a second accumulation circuit which receives output of the second logical sum calculator as a second clock signal and outputs a second toggle signal to a second probing pad in response to the second clock signal.

4. The semiconductor memory device of claim 3, wherein the THV includes a first THV which penetrates the memory cell region to connect the first accumulation circuit and the first probing pad, and a second THV which penetrates the memory cell region to connect the second accumulation circuit and the second probing pad.

5. The semiconductor memory device of claim 2, wherein:
the first state signal and the second state signal among the plurality of state signals are continuously output,
the first state signal is provided to the logical sum calculator after an output duration of the first state signal is shortened by a reduction flip-flop, and
the second state signal is provided to the logical sum calculator without going through a flip-flop.

6. The semiconductor memory device of claim 1, wherein the output of the accumulation circuit is fed back and provided as an input of the accumulation circuit.

7. The semiconductor memory device of claim 6, wherein:
the output of the accumulation circuit and the VDD voltage (1) are input to an exclusive logical sum calculator, and
the output of the exclusive logical sum calculator is provided as the input of the accumulation circuit.

8. The semiconductor memory device of claim 1, wherein the accumulation circuit includes an accumulation flip-flop which receives the output of the logical sum calculator as the clock signal and outputs the toggle signal to the probing pad in response to the clock signal.

9. The semiconductor memory device of claim 1, wherein:
the memory cell region includes a memory cell region substrate including a first surface which is not in contact with the peripheral circuit region and faces the memory cell array, and a second surface facing the first surface,
the probing pad is placed on the second surface of the memory cell region substrate, and the THV penetrates the memory cell region and the memory cell region substrate and is connected to the probing pad.

10. The semiconductor memory device of claim 1, wherein the THV penetrates the memory cell region and is connected to the probing pad without penetrating another substrate.

11. A semiconductor memory device comprising:
a memory cell array;
a state machine configured to output a plurality of state signals in response to operation commands of the memory cell array, and that includes a first flip-flop which outputs a first state signal among the plurality of state signals, and a second flip-flop which outputs a second state signal which is output after the output of the first state signal among the plurality of state signals;
a logical sum calculator configured to perform a logical sum calculation based on at least one of the first state signal or the second state signal; and
an accumulation circuit configured to receive an output of the logical sum calculator as a clock signal and output a toggle signal, the output of the accumulation circuit being fed back and provided to the accumulation circuit.

12. The semiconductor memory device of claim 11, wherein:
the first state signal is an even-numbered state signal among the plurality of state signals,
the second state signal is an odd-numbered state signal among the plurality of state signals,
the logical sum calculator includes a first logical sum calculator which performs a logical sum calculation on the first state signal, and a second logical sum calculator which performs a logical sum calculation on the second state signal, and
the accumulation circuit includes a first accumulation circuit which receives output of the first logical sum calculator as a first clock signal and outputs a first toggle signal to a first probing pad in response to the first clock signal, and a second accumulation circuit which receives output of the second logical sum calculator as a second clock signal and outputs a second toggle signal to a second probing pad in response to the second clock signal.

13. The semiconductor memory device of claim 11, wherein:
the first state signal and the second state signal among the plurality of state signals are continuously output,
the first state signal is provided to the logical sum calculator as a first reduction state signal via a reduction flip-flop, and
the second state signal is provided to the logical sum calculator without going through a flip-flop.

14. The semiconductor memory device of claim 13, wherein a duration of the first reduction state signal is shorter than a duration of the second state signal.

15. The semiconductor memory device of claim 11, wherein:
the output of the accumulation circuit and a VDD voltage (1) are input to an exclusive logical sum calculator, and
the output of the exclusive logical sum calculator is provided as the input of the accumulation circuit.

16. The semiconductor memory device of claim 11, wherein the accumulation circuit includes an accumulation flip-flop which receives the output of the logical sum calculator as the clock signal and outputs the toggle signal to one probing pad in response to the clock signal.

17. A semiconductor memory device comprising:
a memory cell region including a first conductive element;
a peripheral circuit region which includes a second conductive element vertically connected to the first conductive element, and is vertically connected to the memory cell region through the first and second conductive elements;
a plurality of cell strings each of which includes a plurality of memory cells in the memory cell region, the plurality of cell strings including a plurality of word lines connected to the plurality of memory cells, a plurality of bit lines connected to one end of the plurality of cell strings, and a ground selection line connected to the other end of the plurality of cell strings;
a state machine configured to output a plurality of state signals in response to operation commands of the plurality of cell strings inside the peripheral circuit region, the plurality of state signals including a first state signal output from a first output terminal, and a second state signal output after the output of the first state signal from a second output terminal different from the first output terminal;
a logical sum calculator configured to perform a logical sum calculation based on at least one of the first state signal and the second state signal; and
control logic including an accumulation circuit configured to receive the output of the logical sum calculator as a clock signal, and to output a toggle signal to one probing pad in response to the clock signal, the accumulation circuit being connected to the probing pad through a Through Hole Via (THV) penetrating the memory cell region.

18. The semiconductor memory device of claim 17, wherein:
the first state signal is an even-numbered state signal among the plurality of state signals,
the second state signal is an odd-numbered state signal among the plurality of state signals,
the logical sum calculator includes a first logical sum calculator which performs a logical sum calculation on the first state signal, and a second logical sum calculator which performs a logical sum calculation on the second state signal,
the accumulation circuit includes a first accumulation circuit which receives output of the first logical sum calculator as a first clock signal and outputs a first toggle signal to a first probing pad in response to the first clock signal, and a second accumulation circuit which receives output of the second logical sum calculator as a second clock signal and outputs a second toggle signal to a second probing pad in response to the second clock signal.

19. The semiconductor memory device of claim 18, wherein the THV includes a first THV which penetrates the memory cell region to connect the first accumulation circuit and the first probing pad, and a second THV which penetrates the memory cell region to connect the second accumulation circuit and the second probing pad.

20. The semiconductor memory device of claim 17, wherein:
the memory cell region includes a memory cell region substrate including a first surface which is not in contact with the peripheral circuit region and faces the plurality of cell strings, and a second surface facing the first surface, the probing pad is placed on the second surface of the memory cell region substrate, and the THV penetrates the memory cell region and the memory cell region substrate and is connected to the probing pad.

\* \* \* \* \*